United States Patent [19]
Pollmeier

[11] 4,328,538
[45] May 4, 1982

[54] SWITCHING ARRANGEMENT TO PROTECT A COMPONENT AGAINST OVERCURRENT DUE TO MAGNETIC SATURATION OF AN INDUCTOR

[75] Inventor: Werner Pollmeier, Verl, Fed. Rep. of Germany

[73] Assignee: Nixdorf Computer AG, Paderborn, Fed. Rep. of Germany

[21] Appl. No.: 140,468

[22] Filed: Apr. 17, 1980

[30] Foreign Application Priority Data

Apr. 25, 1979 [DE] Fed. Rep. of Germany ....... 2916775

[51] Int. Cl.³ .......................................... H02H 7/122
[52] U.S. Cl. ..................................................... 363/56
[58] Field of Search ..................................... 363/18–21, 363/55–57, 131, 133, 134

[56] References Cited

U.S. PATENT DOCUMENTS 3,333,179  7/1967  Freeman ................................ 363/49
3,412,309  11/1968  Boonstra ................................ 363/57
3,539,905  11/1970  Schwarz ................................ 363/56
3,832,573  8/1974  Ver Planck et al. ............. 363/57 X
4,065,713  12/1977  Pollmeier ............................. 363/19
4,162,524  7/1979  Jansson ........................... 363/21 X Primary Examiner—William M. Shoop
Attorney, Agent, or Firm—Freilich, Hornbaker, Wasserman, Rosen & Fernandez

[57] ABSTRACT

Circuit arrangement for the protection of a component, particularly a switching semiconductor, which is series connected to a voltage source via an inductor, against an overcurrent due to magnetic saturation of the inductor, a second inductor in the series circuit, which limits the overcurrent during the response time of an excess current cutoff and whose magnetizing current is roughly linear over time, at least during the unsaturated state of the first inductor, and does not exceed the maximum permissible current value for the component to be protected during the entire response time.

13 Claims, 3 Drawing Figures

SWITCHING ARRANGEMENT TO PROTECT A COMPONENT AGAINST OVERCURRENT DUE TO MAGNETIC SATURATION OF AN INDUCTOR

BACKGROUND OF THE INVENTION

1. Field of the Invention

The invention concerns a circuit arrangement for the protection of a component that is series-connected to a voltage source with an inductor, particularly a switching semiconductor, against an overcurrent caused by magnetic saturation of the inductor.

2. Description of the Prior Art

Application examples of switching semiconductors in connection with inductors are, e.g. the single ended throughput current transformer, the push-pull throughput current transformer, or DC motors controlled by switching semiconductors. There are numerous other applications in which a component that is series-connected to an inductor can be protected against the overcurrent that occurs in the case of magnetic saturation of the inductor. The invention is described in its application to a throughput current transformer circuit below, but for the above reasons it is not intended to be limited to this application.

The magnetic saturation of the core material of an inductor may have different causes. One reason for magnetic saturation may be an excessive operating voltage to which the inductor and the component that is series-connected with it, and is to be protected, are connected. Magnetic saturation can also result from a switch in series with the inductor, for example the already mentioned switching semiconductor, remaining cut in too long, so that the magnetization current in the inductor exceeds the saturation value. This error may occur in current transformer circuits, for example, in which a switching semiconductor is series-connected with the primary winding of a transducer. In single ended throughput current transformers insufficient demagnetization of the inductor of the transducer may also occur, prior to the renewed cut-in of the switching semiconductor, which also causes magnetic saturation of the transducer. This state may correspondingly occur in a push-pull throughput current transformer, if the transducer was insufficiently backmagnetized prior to each cut-in of the switching semiconductor.

The above described cases result from malfunctions of the voltage supply or the control circuits within the described current transformer circuits. In a push-pull throughput current transformer one must principally expect saturation upon the first cut-in, unless the energizing period is additionally reduced for the cut-in. In such circuits an asymmetry of the switching periods of the switching semiconductors being used and the related DC bias on the transducer may cause magnetic saturation.

The magnetic saturation of the core material of an inductor brings about a severe drop in inductance, accompanied by a steep rise in current over time. It is now possible to provide special protective circuits for overcurrent cutoff, which open the circuit when the current corresponding to the point of magnetic saturation is reached. Such overcurrent cutoffs take place with an unavoidable delay, however, so that the component to be protected is still exposed to a relatively high excess current during the delay time. Such a delay is particularly detrimental in the case of series connections of inductors and switching semiconductors, since these have a long switching delay, corresponding to their rather long storage time, on the order of about 2 to 3 microseconds, during which they can be destroyed by the described overcurrent, even if a special current guard circuit causes them to be disconnected when the inductor with which they are series-connected reaches the saturation state.

OBJECTS AND SUMMARY OF THE INVENTION

It is a primary object of the invention to provide an improved protection arrangement for components that are series-connected with saturable inductors, which reliably prevents excessive overcurrent, even during a switching delay.

A switching arrangement of the initially mentioned kind is configured, according to the invention, by adding a second inductor to the series circuit, which limits the overcurrent during the response time of an overcurrent cutoff. Also, the magnetization current of the second inductor is roughly linear over time, as least during the unsaturated state of the first inductor, and does not exceed a maximum permissible current value for the component during the cited response time.

The series connection of the second inductor with the first inductor, and the stated characteristics of this additional inductor, cause the total inductor formed by the first and second inductors to have a magnetization current curve over time that no longer has the characteristic break due to magnetic saturation and the associated, extreme slope in the saturation region. If in the arrangement the magnetization current of the second inductor is linear over time, at least as long as is the case with the saturable inductor, and if this magnetization current also does not exceed the maximum current that is permissible for the component during the response time of an overcurrent cutoff, this defines the characteristics of the second inductor in such a manner, that it does not allow magnetic saturation during the time span being considered here. This means that the second inductor may have roughly the characteristics of a storage choke, whose hysteresis curve is clipped by an air gap in the core material, and which therefore has a roughly constant current rise over time.

If the series circuit of the two inductors is continuously connected to a voltage source by a switching semiconductor, for example, and if one of the above described malfunctions occurs, the second inductor cannot be saturated, if the first one is, since its characteristics are defined in the above cited manner. Therefore, the second inductor acts as a current-limiting resistor in series connection with the first inductor, so that the current flowing through the entire series circuit cannot exceed the maximum permissible current for the component to be protected, e.g. the switching semiconductor, during the cited response time of an overcurrent cutoff.

The circuit arrangement may be further configured so that a diode is connected in parallel with the second inductor, which is polarized to short over voltages that occur when the series circuit is opened. This diode may also be series connected with a Zener diode and/or an ohmic resistor. These additional elements bring about an accelerated discharge of the second inductor over the cited diode, since they shorten the discharge time constant.

DETAILED DESCRIPTION OF THE PREFERRED EMBODIMENTS

Figure 1:
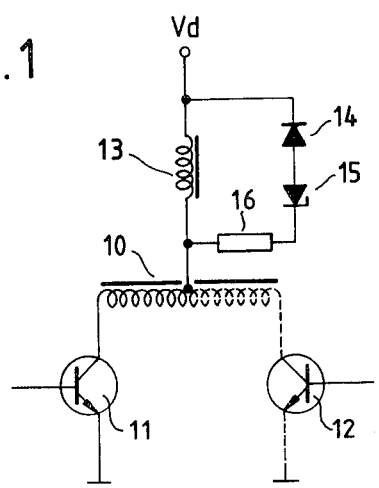
FIG. 1 is a schematic diagram of one application of the invention in connection with a throughput current transformer.

FIG. 1 is a schematic diagram, showing an inductor 10 with iron core, which is series-connected with a switching semiconductor 11. Also shown is another inductor 13. This series circuit is connected to an operating voltage +Vd and may be the primary circuit of a single-ended throughput current transformer, for example. Another part of the inductor 10 is shown in broken lines. It is connected to another switching semiconductor 12 by a connection, shown in broken lines, so that this supplement makes up a push-pull throughput current transformer, with the second inductor 13 being connected to the center tap of the inductor 10. The operation of a throughput current transformer is well known and therefore need not be explained in greater detail.

If one of the above described malfunctions occurs in the described circuit, which is connected with the operating voltage Vd, the inductor 10 of the transducer, whose secondary winding is not shown in FIG. 1, may be magnetically saturated, which may destroy the switching semiconductor 11 and the switching semiconductor 12, if applicable. This is attributable to the fact that, in spite of the likelihood that overcurrent cutoff is provided, which is not shown in FIG. 1, there is a delay between the activation of the respective switching semiconductor 11 resp. 12 and the actual opening of the circuit shown in FIG. 1, during which the magnetization current of the inductor 10 could rise so steeply, that it exceeds the maximum current permissible for the respective switching semiconductor. This phenomenon is prevented by the second inductor 13, however, which is chosen, as described above, and which makes such a strong rise in the magnetization current in the circuit, shown in FIG. 1, impossible during the described response time.

A diode 14 is connected in parallel with the second inductor 13 and causes the second inductor to be discharged when the circuit is opened. In addition a Zener diode 15 and an ohmic resistance, e.g. resistor 16 are shown, which may be series-connected with the diode 14, either by themselves, or together, and which accelerate the discharge of the second inductor 13 through the already described effect of shortening the discharge time constant.

Figure 2:
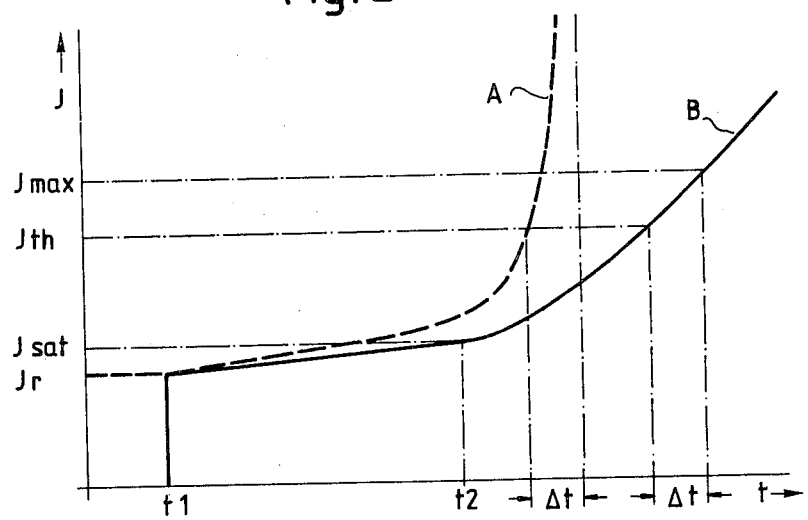
FIG. 2 is a diagram showing the magnetization current curve of a series circuit obtainable with the invention, containing the saturable inductor, the series-connected inductor, and an ohmic load.

FIG. 2 shows the magnetization current curve of the series circuit shown in FIG. 1, taking into account that this series circuit may also contain an ohmic resistance component. The magnetization current J is graphed over time t, starting with the closing of the circuit at time t1. If one assumes a steady state for the series circuit at this time, the current first rises to a value Jr at the time t1, which is due to the ohmic load component.

Then the magnetization current rises roughly linearly until the time t2, with the slope of this part of the characteristic curve being determined by the total inductance of the two inductors 10 and 13 (according to FIG. 1). At the time t2 the saturation current Jsat is reached, which, when exceeded, would make the magnetization current rise very steeply, due to the nearly complete disappearance of the value of inductor 10 (FIG. 1), if it were not for the inductor 13 in the circuit shown in FIG. 1. This very steep rise in magnetization current is represented by the broken line A in FIG. 2.

The overcurrent cutoff, resp. the cutoff of a switching semiconductor 11 and/or 12 (FIG. 1) may now take place with a delay $\Delta t$, which is shown in FIG. 2. Within this delay time the magnetizable current would rise excessively according to the characteristic curve part A, far exceeding the maximum permissible current value Jmax for the component to be protected, so that it might be destroyed, after the current threshold Jth for the response of an overcurrent cutoff that may be provided has been exceeded. The rise of the magnetization current is now reduced by the additional second inductor 13, provided in the circuit. Thus, the characteristic curve section B results, as shown in FIG. 2. This means that in the series circuit, shown in FIG. 1, the inductance value of the second inductor 13 essentially remains, disregarding a residual value that may be left in the first inductor 10. The reduced rise of the characteristic curve section B has the effect that the magnetization current rises at most from the current value Jth to the maximum permissible current value Jmax during the time $\Delta t$. This assures that the component to be protected is not loaded beyond this current value, so that it cannot be destroyed before the circuit shown in FIG. 1 is opened.

The above description implies that the described circuit arrangement must generally satisfy the following condition:

$$\frac{\Delta t \cdot Vd}{Jmax - Jth} \leq L\,13 + L\,10\,sat$$

where L 13 and L 10 are the inductance values of the second inductor 13, resp. the first inductor 10 in the saturated state.

In a practical application in a throughput transformer circuit, the time between the cut-in of the circuit shown in FIG. 1 and the reaching of the current threshold Jth may be about 20 microseconds, while the time $\Delta t$ is about 3 microseconds.

Figure 3:
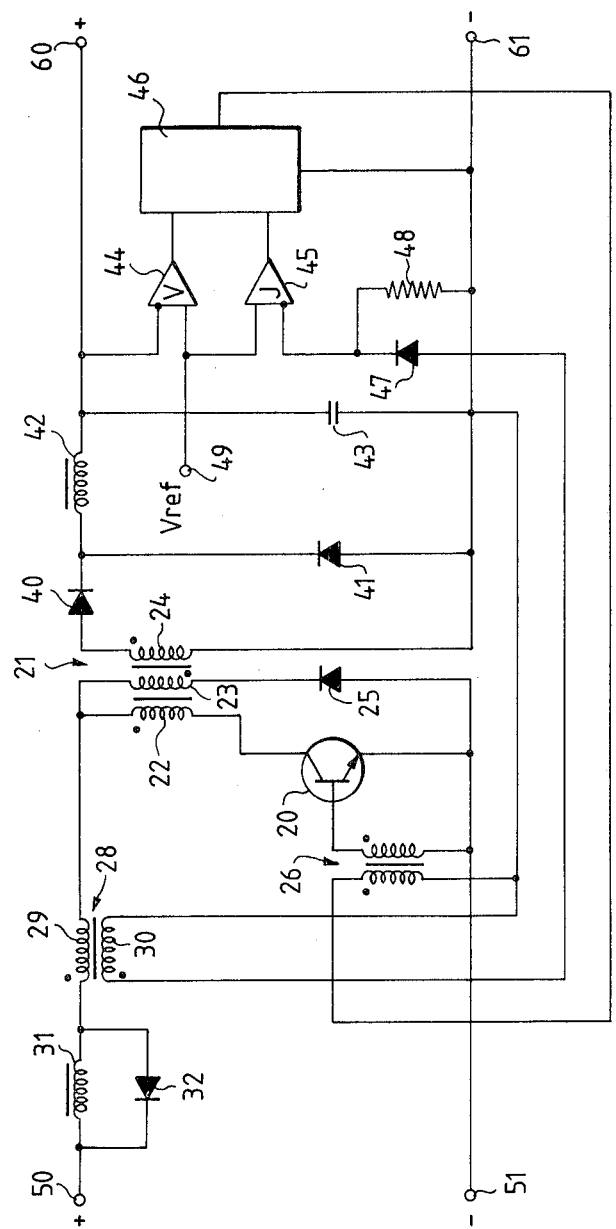
FIG. 3 is a schematic diagram of the invention in a single-ended throughput current transformer arrangement and its circuitry configuration.

FIG. 3 shows a single ended throughput current transformer in its circuitry configuration in combination with a circuit arrangement according to the invention. In this transformer the energy flow to be transferred by its transformer 21 occurs in the cut-in phase of the switching transistor 20. The primary winding 22 of the transformer 21 is series-connected with this switching transistor 20, and this series circuit is connected with the input connections 50 and 51, to which a supply voltage is applied, which is to be transformed into a different output voltage by the single-ended throughput current transformer, which can be taken off at the output connections 60 and 61.

The transformer 21 has a secondary winding 24, whose ends are connected with two rectifier diodes 40 and 41. The pulsating DC voltage that occurs at the connection point of the two rectifier diodes 40 and 41 is smoothed with a filter circuit, consisting of a choke coil 42 and a condenser 43. The smoothed DC that occurs after the filter circuit is present, at the output connection 60, and also at an inverted input of a voltage comparator 44, which compares the smoothed DC voltage with a reference voltage Vref, which is supplied to it via a connection 49. If a deviation from the reference voltage Vref occurs in the smoothed DC voltage, the voltage comparator 44 supplies an output signal to a control unit 46, which corresponds to this deviation. This control unit 46 contains a pulse length modulator, whose output signals of constant frequency and variable impulse length, corresponding to the deviation, are supplied to the emitter of the switching transistor 20 via a transformer 26.

The cut-in duration, and hence the impulse length of the output signals of the control unit 46, lies between zero and 50% of the period duration.

This means that under no load conditions, the control unit 46 controls the switching transistor 20 only for a very short time. Under load on the current transformer, the cut-in period of the switching transistor 20 is 50% of the period duration, at most, for in the lock phase of the current transformer the transformer 21 must be demagnetized through its winding 23 and the series-connected diode 25.

The primary winding 22 of the transformer 21 is series connected with another transformer 28, having a primary winding 29 and a secondary winding 30. With this transformer 28, the respective instantaneous value of the current flowing through the switching transistor 20 is determined and returned to its inverted input after alteration according to the translation ratio of the transformer 28, via a diode 47, a measurement resistor 48, and a current comparator 45. The current comparator 45 also receives the reference voltage Vref at its second input.

When the voltage that appears at the measurement resistor 48, which is proportional to the pulsing switching current of the switching transistor 20, exceeds the reference voltage Vref, the current comparator 45 gives an output signal to the control unit 46, which makes it possible to cut off the switching transistor 20 for a longer period of time with an output signal from the control unit 46 via the transformer 26. This process occurs in the case of magnetic saturation of the inductor of the transformer 21, for example, as already explained above. In this case the inductance on the primary side of the transformer 21 drops to a low value, and this results in a very quick current rise within the storage time of the switching transistor 20. Even if the control current for the switching transistor 20 is cut off by the output signal of the control unit 46, it remains in a conducting state during its storage period, which may be in the order of about 3 µs, and may be destroyed by the described overcurrent in the case of inductor saturation of the transformer 21.

In order to protect the switching transistor 20 from this overcurrent during its cutoff time, it is series-connected with a parallel circuit consisting of an inductor 31 and a diode 32, in addition to the transformer 28. The function of this arrangement has already been explained in connection with FIGS. 1 and 2. The inductor 31 produces a current limitation during the cutoff time of the switching transistor 20.

In consideration of the above mentioned general condition that must be satisfied by the protective circuit, the inductor 31 has an inductance of 0.48 mH, given an operating voltage of 400 V, a cutoff time of the switching transistor 20 of 3 µs, and a current difference Jmax-Jth of 2.5 A. In this connection it must be remembered that the protective function of the inductor 31 must also be safeguarded for the cut-in cycle of the switching transistor 20 following a malfunction. The current transformer circuit must therefore remain cut off in the case of the above described cutoff by an output signal from the control unit 46, until the current through the inductor 31 has dropped below the threshold value Jth of the current comparator 45 during the protective process. This means that the time during which the control unit 46 holds the switching transistor 20 cut off must be matched to the demagnetization time of the inductor 31. On the basis of the above figures and a minimum voltage drop at the diode 32 of 0.5 V, this demagnetization time is at lease 2.4 ms.

The required cutoff time can be reduced by adding a resistor and/or a Zener diode to the diode 32 in series, as shown in FIG. 1.

Since the inductor 31 has a relatively long demagnetization time, its core need not necessarily be made of high frequency material. It is sufficient to use normal transformer sheet as core material, so that relatively great price and volume reductions are feasible, compared with ferrite material.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. In a circuit comprising a switching component which is serially connected with a first inductor to a voltage source providing a voltage Vd, wherein said switching component is characterized by a cutoff response time definable as $\Delta t$ to an overcurrent cutoff, an arrangement for protecting said component against excessive overcurrent as a result of full magnetic saturation of said first inductor, the arrangement comprising:
a second inductor connected in series with said component and said first inductor across said voltage source, said second inductor being characterized by an inductance value which is a function of Vd, $\Delta t$ and the inductance of the first inductor, whereby even when the first inductor is fully saturated the overcurrent to said component does not exceed a preselected maximum value, definable as Jmax, during $\Delta t$.

2. In a circuit as recited in claim 1, wherein said arrangement further includes a diode connected in parallel across said second inductor, and wherein $$\frac{\Delta t \cdot Vd}{J\max - Jt} \leq L\ 13 + L\ 10 \text{ sat,}$$

wherein Jt represents an overcurrent at the start of $\Delta t$, L13 represents the inductance of said second inductor and L10 sat represents the inductance of said first inductor in the saturated state.

3. In a circuit as recited in claim 2 wherein the arrangement further includes a Zener diode connected in series with said diode across said second inductor.

4. In a circuit as recited in claim 2 wherein the arrangement further includes a resistor connected in series with said diode across said second inductor.

5. In a circuit as recited in claim 4 wherein said arrangement further includes a Zener diode, connected in series with said diode and said resistor across said second inductor.

6. A circuit arrangement comprising:
first and second input terminals adapted to be connected to a DC voltage source;
a first transformer having at least a primary winding and a secondary winding;
a switching component;
first means for connecting the primary winding of said first transformer and said switching component in series across said input terminals;
said first means including an inductor and the primary winding of a second transformer which are connected in series with the primary winding of said first transformer and said component across said input terminals;
second means for connecting the secondary winding of said first transformer to a pair of output terminals;
a source of a reference voltage; and
control means including the secondary winding of said second transformer and a control circuit for sensing the instantaneous current flowing through said component and for providing a control signal to cut off said component into a non-conductive state for a selected period when the instantaneous current sensed by the secondary winding of said second transformer produces a voltage which exceeds said reference voltage.

7. A circuit arrangement as recited in claim 6, wherein said control means includes a first diode and a resistor connected in series with the secondary winding of said second transformer, whereby the voltage at the junction of said resistor and first diode is related to the instantaneous current through said secondary winding, a comparator for comparing the reference voltage from said reference source and the voltage at said junction point, and for activating said control circuit to drive said component to its cutoff state for a selected duration when the voltage at said junction point exceeds said reference voltage.

8. A circuit arrangement as recited in claim 6, further including a second diode connected in parallel across said inductor.

9. A circuit arrangement as recited in claim 7 wherein said switching component is a transistor with its collector and emitter path being connected in series with the primary winding of said first transformer.

10. A circuit arrangement as recited in claim 9, further including a third transformer with a first winding connected to and responsive to the control signal from said control circuit and a second winding connected to the base of said transistor.

11. A circuit arrangement as recited in any of claims 7, 8 or 10, wherein said first transformer includes a third winding and a third diode, and means connecting said third winding and third diode in parallel with the primary winding of said first transformer and said component.

12. A circuit arrangement as recited in claim 6, wherein said second means include a second comparator for comparing the output DC voltage across said output terminals with said reference voltage and for providing a signal to said control circuit to vary the on time of each signal provided thereby to said component as a function of the difference between the voltage at said output terminals and said reference voltage.

13. A circuit arrangement as recited in claim 8 wherein said switching component is a transistor with its collector and emitter path being connected in series with the primary winding of said first transformer.

* * * * *